(12) United States Patent
Engbrecht et al.

(10) Patent No.: US 7,144,803 B2
(45) Date of Patent: Dec. 5, 2006

(54) METHODS OF FORMING BORON CARBO-NITRIDE LAYERS FOR INTEGRATED CIRCUIT DEVICES

(75) Inventors: Edward R. Engbrecht, Austin, TX (US); John G. Ekerdt, Austin, TX (US); Yang-Ming Sun, Austin, TX (US); Kurt H. Junker, Austin, TX (US)

(73) Assignee: Semiconductor Research Corporation, Durham, NC (US)

( * ) Notice: Subject to any disclaimer, the term of this patent is extended or adjusted under 35 U.S.C. 154(b) by 134 days.

(21) Appl. No.: 10/826,564

(22) Filed: Apr. 16, 2004

(65) Prior Publication Data
US 2004/0259353 A1 Dec. 23, 2004

Related U.S. Application Data
(60) Provisional application No. 60/463,570, filed on Apr. 17, 2003.

(51) Int. Cl.
*H01L 21/4763* (2006.01)
(52) U.S. Cl. .............. 438/622; 438/763; 257/758; 257/E21.547
(58) Field of Classification Search ............ 438/622, 438/763
See application file for complete search history.

(56) References Cited

U.S. PATENT DOCUMENTS

| | | | |
|---|---|---|---|
| 4,868,093 A * | 9/1989 | Levy | 430/311 |
| 5,895,938 A | 4/1999 | Watanabe et al. | |
| 6,288,448 B1 | 9/2001 | Pramanick | |
| 6,352,921 B1 | 3/2002 | Han et al. | |
| 6,424,044 B1 | 7/2002 | Han et al. | |
| 6,500,771 B1 | 12/2002 | Vassiliev et al. | |

OTHER PUBLICATIONS

Ekerdt et al., Design, growth and Properties of Boron Carbonitride Insulating diffusion Barriers for Nanosized Electronic Devices.*
Kosinova et al., Chemical Composition of Boron Carbonitride Films Grown by Plasma-Enhanced Chemical Vapor Deposition from Trimethylamine borane, 2003, Inorganic Materials, pp. 366-373.*
Fayolle et al.; Integration of Cu/SIOC in Dual Damascene interconnect for 0.1μm technology using a new SiC material as dielectric barrier 2002 *IEEE International Interconnect Technology Conference*, Burlingame, CA 39-41 (2002).
Gelatos et al.; "The Properties of a Plasma Deposited Candidate Insulator for Future Multilevel Interconnects Technology" *Mat. Res. Soc. Symp.* 250 347-354 (1992).
Levy et al. "Evaluation of LPCVD Boron Nitride as a Low Dielectric Constant Material" *Mat. Res. Soc. Symp.* 427 469-478 (1996).
Martin et al.; "Inegration of SiCN as a Low κ Etch Stop and Cu Passivation in a High Performance Cu/Low κ Interconnect "2002 *IEEE International Interconnect Technology Conference*, Burlingame, CA 4244 (2002).
Nguyen et al.; "Plasma-Assisted Chemical Vapor Deposition and Characterization of Boron Nitride Films" *J. Electrochem. Soc.*, 141:6 1633-1638 (1994).
Sugino et al.; "Dielectric constant of boron carbon nitride films synthesized by plasma-assisted chemical-vapor deposition" *Applied Physics Letters* 80:4 649-651 (2002).

* cited by examiner

*Primary Examiner*—Tu-Tu Ho
(74) *Attorney, Agent, or Firm*—Myers Bigel Sibley & Sajovec, P.A.

(57) ABSTRACT

The present invention includes methods for forming a boron carbo-nitride layer. Additional embodiments include thermal chemical vapor deposition methods for forming a boron carbo-nitride layer. Also integrated circuit devices with a boron carbo-nitride layer are disclosed.

17 Claims, 4 Drawing Sheets

METHODS OF FORMING BORON CARBO-NITRIDE LAYERS FOR INTEGRATED CIRCUIT DEVICES

CROSS-REFERENCE TO RELATED APPLICATIONS

The present application claims priority from U.S. Provisional Patent Application No. 60/463,570, filed Apr. 17, 2003, the disclosure of which is incorporated herein by reference in its entirety.

FIELD OF THE INVENTION

The present invention relates to compositions and methods for depositing a metal layer.

BACKGROUND OF THE INVENTION

The microelectronics industry is continuously scaling down feature sizes and developing new material applications in the pursuit of smaller and faster devices. One focus towards this goal is the implementation of copper into multi-level interconnect schemes for microprocessor and memory devices as copper offers improved electromigration resistance and higher electrical conductivity versus aluminum-based interconnects. The semiconductor industry is introducing copper interconnects as a replacement for conventional aluminum and aluminum alloy interconnects for future generations of semiconductor devices. With its greater current carrying capacity, the introduction of copper interconnects should reduce device geometry, power consumption and heat generation. However, copper is a fast diffuser in silicon and diffuses in dielectrics, resulting in a deterioration of devices at low temperatures. To avoid unwanted migration of copper atoms, the copper wiring should be encapsulated with a barrier layer, e.g., barrier diffusion layer, to prevent diffusion of copper. The encapsulation of copper wiring is commonly done using a combination of an underlayer of a low-resisitivity transition metal-based material and an insulating layer comprised of a Si-based film. Each of these barriers may be comprised of more than one material to maximize properties and performance, i.e. a bilayer of Ta/TaN or bilayer of $SiN_x/SiC_xN_y$. In order to minimize the capacitance contribution of the insulating diffusion barrier to the RC time delay, a desirable insulating barrier may have a low dielectric constant, k, to limit overall capacitance when integrated into the interconnect design.

One method of providing the insulating barrier layer is through plasma enhanced chemical vapor deposition (PECVD). Thermal chemical vapor deposition (TCVD) is a process in which a flow of gaseous reactants over a heated semiconductor substrate chemically react to deposit a solid layer on the heated substrate. PECVD is a process which introduces a plasma to activate the gaseous reactants. In each case, the flow of the reactants can be in parallel or in series, whereby a series flow of reactants is sometimes referred to as atomic layer deposition.

One current manufacturing technology for producing an insulating barrier layer generally is transitioning from plasma enhanced chemical vapor deposited (PECVD) $SiN_x$ to PECVD $SiC_xN_y$ and $SiC_x$ because these materials generally have a lower dielectric constant. Recent studies have reported PECVD $SiC_xN_y$ films with dielectric constants of approximately 5 and PECVD $SiC_x$ films with a dielectric constant less than 5, resulting in an approximately 25% lower a dielectric constant compared to PECVD $SiN_x$. See, Martin et al., 2002 IEEE International Interconnect Technology Conference, Burlingame, Calif., Jun. 3–5, 2002, 42; and Fayolle et al., 2002 IEEE International Interconnect Technology Conference, Burlingame, Calif., Jun. 3–5, 2002, 39. However, PECVD film deposition can cause damage to the bulk insulating material, commonly referred to as the intermetal/intrametal dielectric. Also, current Si-based PECVD films may not meet future performance requirements, such as adhesion to other interconnect films, electromigration performance with copper, barrier properties, or low current leakage.

Additionally, boron has been utilized in high density plasma chemical vapor deposition. See, U.S. Pat. No. 6,500,771. U.S. Pat. No. 5,895,938 illustrates semiconductor devices using semiconductor boron carbo-nitride compounds such as a light-emitting device and a solar cell. The '938 patent illustrates a CVD process to form a boron carbo-nitride compound to grow into a crystalline structure wherein a substrate temperature at 850° C. or more was used in the step of forming the boron carbo-nitride compound. U.S. Pat. No. 6,424,044 shows a method of forming a boron carbide layer formed in a PECVD for use as a barrier and an etch-stop layer in a copper dual damascene structure. U.S. Pat. No. 6,352,921 illustrates amorphous boron carbide is formed in a PECVD for use as a barrier and an etch-stop layer in a copper dual damascene structure. U.S. Pat. No. 6,288,448 a process of combining silane and ammonia in a boron rich atmosphere for semiconductor interconnect barrier material for use with copper interconnects.

$BC_x$ and $BC_xN_y$ films have been reported with a dielectric constant ranging from 3 to 7. See, Sugino et al., *Applied Physics Letters*, Vol. 80, No. 4, 649; Gelatos et al., *MRS*, Vol. 260, 1992, 347; Levy et al., *MRS*, vol. 427, 1996, 469; and Nguyen et al., *J. Electrochem. Soc.*, Vol. 141, No. 6, 1994, 1633. For the deposition of boron carbo-nitride films using dimethylamine borane (DMAB), the increase in the dielectric constant with increasing temperature may be caused by a higher atomic density in the films that leads to a higher polarizability. Sugino, et al., observed an increase in the dielectric constant with temperature for films deposited by PECVD using $BCl_3/N_2/CH_4$, while Gelatos, et al, observed a higher temperature with a decreasing dielectric constant for PECVD films using $B_2H_6/NH_3$.

SUMMARY OF THE INVENTION

Embodiments of the present invention include methods for forming a boron carbo-nitride layer forming a boron carbo-nitride layer on a substrate by chemical vapor deposition using a boron source precursor comprising $NR_3:BX_3$, wherein X is selected from the group consisting of hydrogen and halide and wherein R is selected from the group consisting of hydrogen, alkyl, allyl, alkenyl, alkynyl alkylaryl, arylalkyl, phenyl, alkene and alkyne. The chemical vapor deposition can be a thermal chemical vapor deposition.

Other embodiments of the present invention can include a thermal chemical vapor deposition methods comprising providing a semiconductor substrate within a chemical vapor deposition chamber, vaporizing a boron source precursor with a vaporizer to form a flowing vaporized precursor stream, and directing the flowing vaporized precursor stream to flow into the chamber with the substrate therein under conditions effective to chemical vapor deposit a dielectric layer over the substrate. The boron source precursor can be combined with a nitrogen source and a carbon source.

Additional embodiments of the present invention include integrated circuit devices with a boron carbo-nitride layer. The boron carbo-nitride layer may comprise an amorphous boron carbo-nitride layer.

Further embodiments of the present invention include integrated circuit devices comprising a copper interconnect structure including an amorphous boron carbo-nitride barrier layer.

DETAILED DESCRIPTION OF THE EMBODIMENTS

Figure 1:
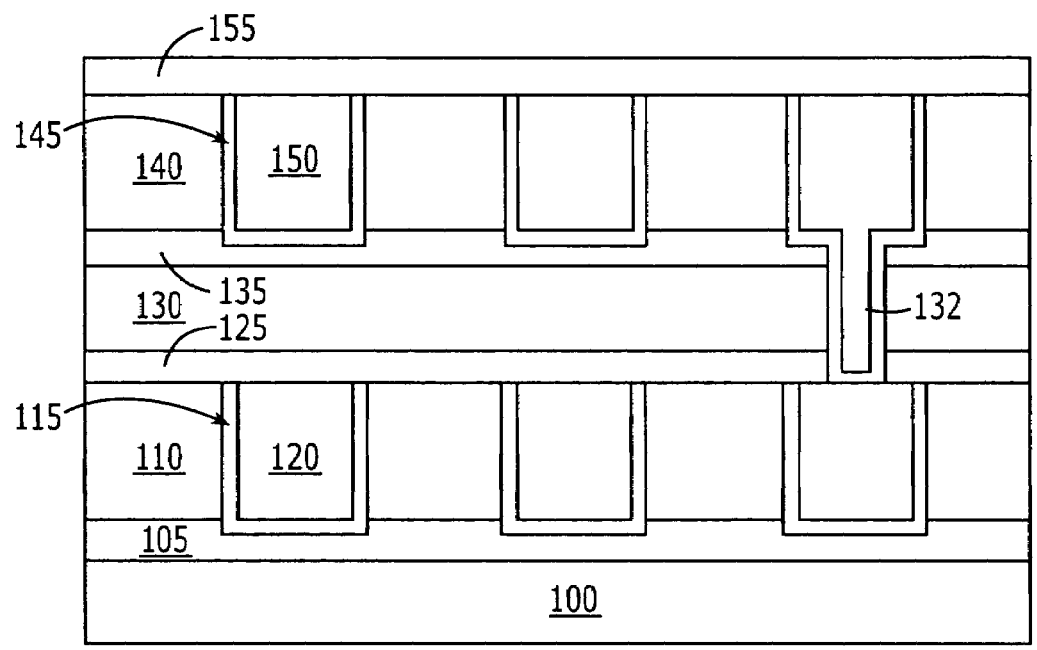
FIG. 1 shows a cross-sectional view of a copper interconnect.

The foregoing and other aspects of the present invention will now be described in more detail with respect to the embodiments described herein. It should be appreciated that the invention may be embodied in different forms and should not be construed as limited to the embodiments set forth herein. Rather, these embodiments are provided so that this disclosure will be thorough and complete, and will fully convey the scope of the invention to those skilled in the art. It will be understood that when an element such as a layer, a region or an integrated circuit device is referred to as being "on" another element, it can be directly on the other element or intervening elements may also be present. It will be understood that if part of an element, such as a surface of a conductive line, is referred to as "outer", it is closer to the outside of the integrated circuit than other parts of the element. Furthermore, relative terms such as "beneath" may be used herein to describe a relationship of one layer or region to another layer or region relative to an integrated circuit device or a base layer as illustrated in the figures. It will be understood that these terms are intended to encompass different orientations of the device in addition to the orientation depicted in the figures. Finally, the term "directly" means that there are no intervening elements.

As newer low dielectric materials with lower thermal stability are being used, the maximum temperatures to which semiconductor devices can be subjected during manufacture decreases. $BC_x$ and $BC_xN_y$ films are two films that can have a low dielectric constant. Embodiments of the invention can include boron carbo-nitride layers and methods of forming boron carbo-nitride layers for use, for example, as a barrier and etch stop layer in copper interconnect structures used in integrated circuit manufacturing.

In some instances, there are problems attendant upon conventional copper interconnect methodology employing a diffusion barrier layer. However, due to copper diffusion through dielectric interlayer materials, such as silicon dioxide, copper interconnect structures must be encapsulated by a diffusion barrier layer. Currently, a combination of conductive and insulating barriers are employed. Typical conducting diffusion barrier metals include tantalum (Ta), tantalum nitride (TaN), titanium nitride (TIN), titanium-tungsten (TiW), tungsten (W), tungsten nitride (WN), Ti—TiN, titanium silicon nitride (TiSiN), tungsten silicon nitride (WSiN), tantalum silicon nitride (TaSiN). Typical insulating diffusion barriers materials include silicon nitride (SiN), silicon carbo-nitride (SiCN), silicon carbide (SiC) for encapsulating copper. The use of such barrier materials to encapsulate copper is not limited to the interface between copper and the dielectric interlayer, but can also include interfaces with other metals. However, some capping layers, such as silicon carbide, exhibit poor adhesion to the copper or copper alloy surface. Consequently, the capping layer is vulnerable to removal, as by peeling due to scratching or stresses resulting from subsequent deposition of layers. As a result, the copper or copper alloy is not entirely encapsulated and copper diffusion occurs thereby adversely affecting device performance and decreasing the electromigration resistance of the copper or copper alloy interconnect member. Boron carbo-nitride layers can alleviate some of these problems.

FIG. 1 illustrates a cross-sectional view showing a boron layer deposited via a thermal CVD method. In FIG. 1, a BCN insulating Cu diffusion barrier/etch stop 105 is deposited by CVD on a substrate 100. An interlayer dielectric material, trench low-k, (e.g., PECVD OSG) 110, may be formed on top of the barrier/etch stop 105. A trench or groove trench or groove pattern can be first etched into the interlayer dielectric material 110. A conductive Cu diffusion barrier 115, such as Ta or TaN may be formed within the trench or groove pattern. Copper may then fill the trench or groove pattern. The top surface would then be subject to chemical-mechanical polishing (CMP). A BCN insulating Cu diffusion barrier/etch stop 125 can be formed covering the copper and interlayer dielectric material. This process can be repeated as shown. An interlayer dielectric material 130 is first formed. A BCN trench etch stop 135 (dual inlaid integration) may then be prepared on the interlayer dielectric material 130. A second interlayer dielectric material 140 may be formed on the BCN trench stop 135 and then a trench or groove trench or groove pattern 150 can be etched as noted above. Additionally, the etching may include a copper via 132. Again, a conductive Cu diffusion barrier 145 may be formed within the trench or groove pattern 150. The top surface would then be subject to chemical-mechanical polishing (CMP). Then a BCN insulating Cu diffusion barrier/etch stop 155 would be formed on the copper and interlayer dielectric material 140.

Figure 2:
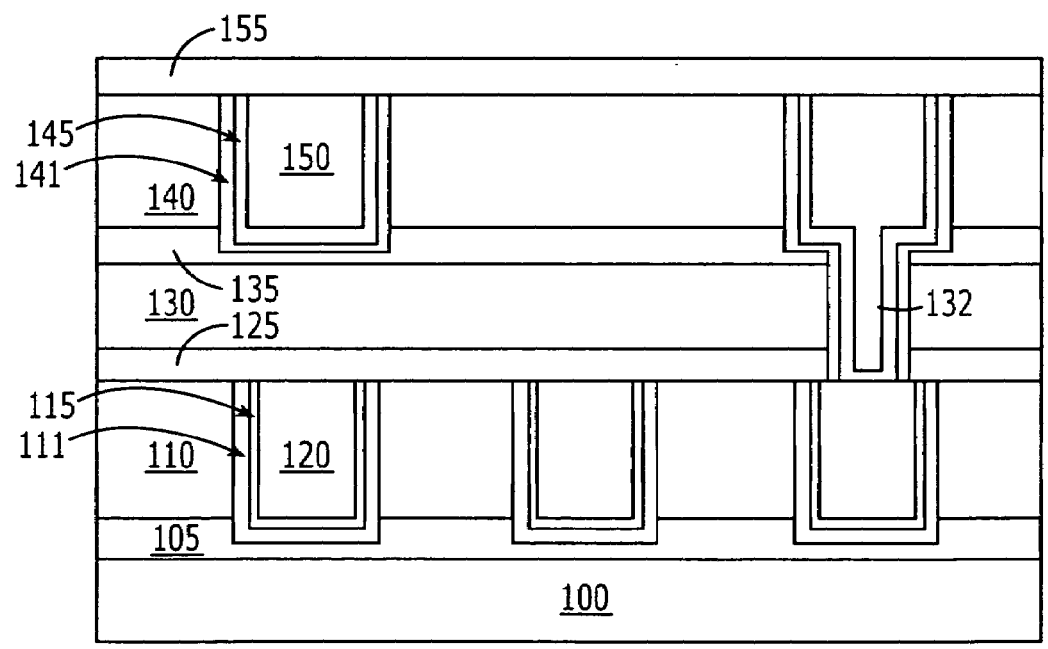
FIG. 2 depicts an cross-sectional view of a copper interconnect.

FIG. 2 also illustrates a cross-sectional view illustrates of a barrier layer surrounding a copper interconnect. Again, a BCN insulating Cu diffusion barrier/etch stop 105 is deposited by CVD on a substrate 100. An opening has been created in the layer 110 of dielectric, a BCN pore seal 111 comprising $BC_xN_y$ has been deposited over the surfaces of the opening created in the surface of layer 110 of dielectric. A conductive Cu diffusion barrier 115 has been formed over the BCN pore seal 111. Copper interconnect 120 has been created overlying the BCN pore seal 111 and conductive Cu diffusion barrier 115, using conventional methods of metal deposition and polishing for the purpose of removing excess copper from the surface of layer 110 of dielectric. An etch stop layer 125 is then typically provided over the surface of layer 110 of dielectric, overlying the surface of copper interconnect 120, after which the process of creating a semiconductor device can proceed with the deposition of an additional layer 130. Additionally, the etch stop layer 125 can comprise $BC_xN_y$. This process can then be repeated to add a second layer as discussed with respect to FIG. 1.

Embodiments of the present invention can include forming a boron carbo-nitride layer on a substrate by chemical vapor deposition using a boron source precursor comprising $NR_3:BX_3$, wherein X is hydrogen and/or halide and wherein R is hydrogen, alkyl, allyl, alkenyl, alkynyl alkylaryl, arylalkyl, phenyl, alkene and/or alkyne.

Boron carbo-nitride films can be deposited by a thermal chemical vapor deposition (CVD) process using a boron source precursor that includes an amine with hydrogen and/or alkyl groups bonded to $BH_3$, such as a dimethylaminoborane complex $(CH_3)_2NH:BH_3$. Additionally, the films can be deposited by pulsed CVD or atomic layer deposition. Ammonia and/or hydrocarbon (e.g., ethylene) reactive gases may be used as nitrogen and carbon sources, respectively. Precursors according to embodiments of the invention may have the composition $NR_3:BH_3$, where R can be any combination of H or alkyl, allyl, alkenyl, alkynyl alkylaryl, arylalkyl, phenyl, alkene and alkyne ligands. The combined ligands may be the same or different. Alkyl ligands may include, but are not limited to, methyl ($CH_3$), ethyl ($CH_3CH_2$), n-propyl ($CH_3CH_2CH_2$), and isopropyl (($CH_3)_2CH$).

Boron carbo-nitride films formed according to some of the embodiments of the invention may be uniformly deposited on patterned structures, such as those commonly used in copper interconnect processing, at temperatures below 450° C., which can limit thermal exposure. In certain embodiments, boron carbo-nitride films may be formed between about 300° C. and about 500° C. Films formed according to some embodiments of the invention can provide desirable electrical properties, such as a dielectric constant less than 4 and low leakage current. Films formed according to some embodiments of the invention can have their composition controlled by varying process parameters to enhance film properties such as adhesion, etch selectivity, and copper barrier effectiveness. Films according to some embodiments of the invention can have a composition $BC_xN_y$, where x can range from about 0 to about 2 and wherein y can range from about 0 to about 1. The films can include but are not limited to, barrier layers, pore-seals, retch stops and the like. These films can assist with barrier performance and pore-sealing.

Embodiments of the present invention can also include thermal chemical vapor deposition methods. According to some embodiments, a semiconductor substrate is provided in a chemical deposition chamber. A boron source precursor is vaporized by a vaporizer to form a flowing vaporized precursor stream, which is directed to flow into the chamber where it contacts the substrate under conditions effective to chemical vapor deposit a dielectric layer over the substrate. The boron source precursor can be $BX_3$, where X can be hydrogen and/or halide and may be the same or different. The boron source precursor can be combined with a nitrogen source and a carbon source, either in parallel flow with the precursor or in series flow or combination thereof. The nitrogen source can be any amine such as ammonia. The carbon source can be a hydrocarbon such as alkyl, allyl, alkenyl, alkynyl alkylaryl, arylalkyl, phenyl, alkene and/or alkyne. Again, the thermal chemical vapor deposition occurs at between about 300° C. and about 500° C. The layer deposited on the integrated circuit device can have a thickness of from about 10 Angstroms to about 1000 Angstroms. Alternatively, the thickness can be from about 20 Angstroms to about 500 Angstroms. Additionally, the thickness can be from about 25 Angstroms to about 300 Angstroms.

Additional embodiments of the present invention can include at least one different precursor, thus creating different layers to be deposited onto the integrated circuit device. The boron carbo-nitride layer can be deposited onto the integrated circuit device or onto on a first metal layer. Additional embodiments of the present invention can further include vaporizing a third precursor and depositing the third precursor on one of the previously formed layers. Any number of precursors may be utilized in such embodiments.

Films formed according to embodiments of the present invention include films having dielectric constants less than 4, which are formed using thermal CVD at relatively low temperatures (e.g., between about 300° C. and 500° C.), which contrasts with conventional techniques that use plasma enhanced CVD. Additionally, the use of thermal CVD can provide for more uniformly deposited films and can reduce or avoid the substrate damage associated with plasma enhanced processes. Embodiments of the invention can reduce capacitance associated with interconnect insulating films by providing a lower dielectric constant material with reduced substrate damage.

Films formed according to embodiments of the invention can also be useful for uniformly sealing exposed pores inherent in porous dielectric films used in interconnect manufacturing. Sealing such pores may reduce or prevent diffusion of conductive precursors into the insulating film. Such use of a boron carbo-nitride film can offer a more conformal deposition within the pores and substrate patterns than conventional films deposited by plasma-enhanced processes, while also offering a low dielectric constant material that can limit increases to interconnect capacitance.

Films formed according to embodiments of the invention can also be useful for encapsulating the copper without the use of a conductive barrier.

Additional embodiments of the present invention can include integrated circuit devices with boron carbo-nitride layer. The boron carbo-nitride layer can be amorphous, substantially amorphous and can also be uniform. Areas of the born carbo-nitride layer that are substantially amorphous can also be found with lattice fringes indicating short range order within the film. The lattice fringes found in some embodiments exhibited a d-spacing of 3.23 Å over 12 fringes. The closest published d-spacing containing boron, carbon, and/or nitrogen is h-BN with a d-spacing of 3.34 Å. Powder and Diffraction File, Joint Committee on Powder Diffraction Standards, ASTM, Philadelphia, Pa., Card 74-1997. As noted other embodiments were amorphous. The amorphous boron carbo-nitride layer can be $BC_xN_y$, wherein x is in a range from about 0 to about 2, and wherein y is in a range from about 0 to about 1. The amorphous boron carbo-nitride layer can be deposited as a film on a dielectric surface, such as $SiO_2$, using various BCN complexes at temperatures ranging from 300° C. to 500° C. and with varying $NH_3$ flow at about 360° C. The BCN source can be formed by combining a boron source precursor with a nitrogen source and a carbon source. The nitrogen source can be any amine such as ammonia. The carbon source can be a hydrocarbon such as alkyl, allyl, alkenyl, alkynyl alkylaryl; arylalkyl, phenyl, alkene and/or alkyne. A higher nitrogen content can be incorporated into the film to create an amorphous film with smooth surface.

The present invention is explained in greater detail in the Examples that follow. These examples are intended as illustrative of the invention and are not to be taken as limiting thereof.

EXAMPLES

Example 1

Creation of BCN Films

Films were deposited by thermal CVD in a film deposition facility consisting of a load lock, sample transfer system, CVD growth chamber, and analysis chamber equipped with X-ray photoelectron spectroscopy (XPS) as described elsewhere. Dimethylamine borane complex [NH(CH$_3$)$_2$:BH$_3$] (DMAB) from Strem Chemicals, Inc. (97% purity) was delivered to the reactor from a stainless steel bubbler containing approximately 50 g of the precursor and held at 27° C. DMAB is a white crystalline solid with a melting point of 36° C. and vapor pressure of 1.5 mTorr at 60° C. DMAB vapor was carried to the reactor by ultra high purity (UHP, 99.999%) argon carrier gas delivered through a mass flow controller. UHP ammonia was also delivered through a mass flow controller. Reaction gas streams were mixed at the reactor doser approximately 4 cm above the substrate surface to minimize gas phase reactions while allowing uniform gas mixing at the substrate surface.

The films were deposited on 7.1 nm gate-quality thermal SiO$_2$ substrates cleaved to 2.2 cm by 2.2 cm squares and mounted on a stainless steel sample holder. Substrates were cleaned prior to film deposition by sequentially using acetone, ethanol, and deionized water. The oxide substrates were then annealed under vacuum to minimize surface contamination. Samples were analyzed in-situ by XPS using a Physical Electronics 5500™ system at a 56.7 eV pass energy. Scanning electron microscopy (SEM) analysis used a LEO 1530™ electron microscope. X-ray diffraction (XRD) was performed with a Phillips automated vertical scanning general purpose diffractometer. Surface roughness measurements were taken on a TM Microscopes AutoProbe CPR™ atomic force microscope (AFM) on 500 nm by 500 nm scanned areas in non-contact mode using a 1 Hz scan rate.

Metal-insulator-metal (MIM) test structures were created using a SSM 495CV™ Hg probe. The capacitance-voltage characteristics of the MIM device were measured using a probe tip area, A$_{MIM}$, of approximately 3.5×10$^{-3}$ cm$^2$ (calibrated using a SiO$_2$ standard) at a frequency of 100 kHz. The total average MIM device capacitance in accumulation mode (C$_{acc}$) was determined from multiple scans on each sample. Samples were mounted on 6 in aluminum discs using silver paste to enable analysis of the small sample squares on a tool designed for larger samples. The accuracy of this mounting technique was verified using known SiO$_2$ samples. The boron carbo-nitride film thickness (d$_{BCN}$) was determined using a two parameter Cauchy film model on spectroscopic ellipsometry (SE) results collected at 70° C. and 75° C. on a J. A. Woollam VASE™ instrument (either an M2000-D™ or M-44™ model). Since the MIM device used represents two capacitors (C$_{oxide}$ and C$_{BCN}$) in series, the dielectric constant of the boron carbo-nitride (k$_{BCN}$) film was calculated using Equation 1, $$k_{BCN} = \frac{d_{BCN}}{\varepsilon A_{MIM}} \left( \frac{1}{C_{acc}} - \frac{1}{C_{oxide}} \right)^{-1} \quad (1)$$

with ε being the permittivity of free space. Boron carbo-nitride films deposited at thicknesses ranging from 20 to 130 nm were used to confirm the dielectric constant results, with no thickness dependence observed.

Example 2

The Effect of Temperature on Film Deposition and Properties

Films were deposited by CVD on thermal SiO$_2$ over a temperature range from 360° C. to 500° C. at 1 Torr to investigate the effect of substrate temperature on film deposition and properties. The argon carrier gas flow rate was held constant through the DMAB bubbler at 10 sccm. Table I shows the film composition measured in-situ using XPS for different deposition temperatures and the resulting dielectric constant. As the temperature increased, the boron concentration decreased while both the nitrogen and carbon increased. Oxygen was under 3 atom (at) % in the films, decreasing with temperature. Films deposited had a stoichiometric composition of BC$_{0.26}$N$_{0.15}$ at 360° C., BC$_{0.37}$N$_{0.17}$ at 420° C., and BC$_{0.37}$N$_{0.25}$ at 500° C. The deposition temperature affected the film deposition rate. The deposition rate was 0.34 nm/min at 360° C., 1.5 nm/min at 420° C., and 4.0 nm/min at 500° C. Table I shows the dependence of the dielectric constant with deposition temperature, increasing from 4.62 at 360° C. to 4.83 at 500° C. The index of refraction, n, measured at 633 nm by SE, also increased with temperature. The average n measured for films deposited at 360° C., 420° C., and 500° C. was 2.069, 2.172, and 2.226, respectively.

TABLE I

| T ° C. | % B | % C | % N | % O | k |
|---|---|---|---|---|---|
| 360 | 69.4 | 10.5 | 17.8 | 2.3 | 4.62 |
| 420 | 64.5 | 10.8 | 23.8 | 0.9 | 4.65 |
| 500 | 61.6 | 15.5 | 22.5 | 0.4 | 4.83 |

Figure 3:
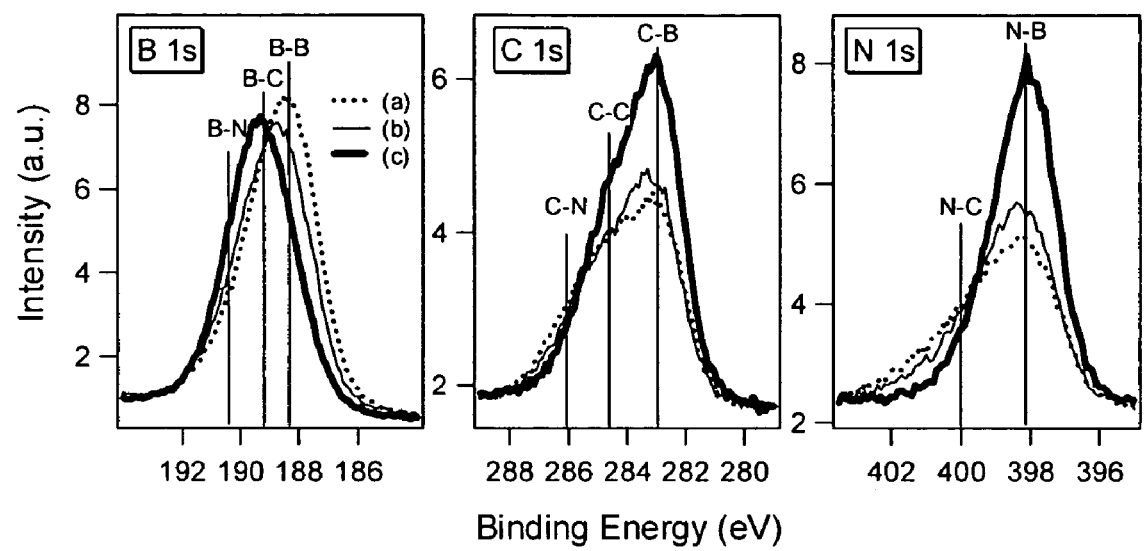
FIG. 3 illustrates the XP spectra of B 1s, C 1s, and N 1s for films deposited on $SiO_2$ using DMAB with no reactive gas at (a) 360° C., (b) 420° C., and (c) 500° C.

FIG. 3 illustrates the high-resolution XP spectra of boron (B 1s), carbon (C 1s), and nitrogen (N 1s) for films deposited at different substrate temperatures. Line (a) illustrates a deposition at 360° C. Line (b) represents the boron carbonitride film being deposited at 420° C. Line C depicts a film deposited at 500° C. The B 1s peak shifts to higher binding energy (BE) as the temperature increases, with the shift corresponding to a change in chemical states from predominantly B—B bonding (188.3 eV) at 360° C. to higher levels of B—C (189.2 eV) and B—N (190.4 eV) bonding. The C 1s and N 1s XP spectra each show an increase in the bonding to boron as temperature increases along with a decrease in the bonding of carbon to nitrogen.

Figure 4:
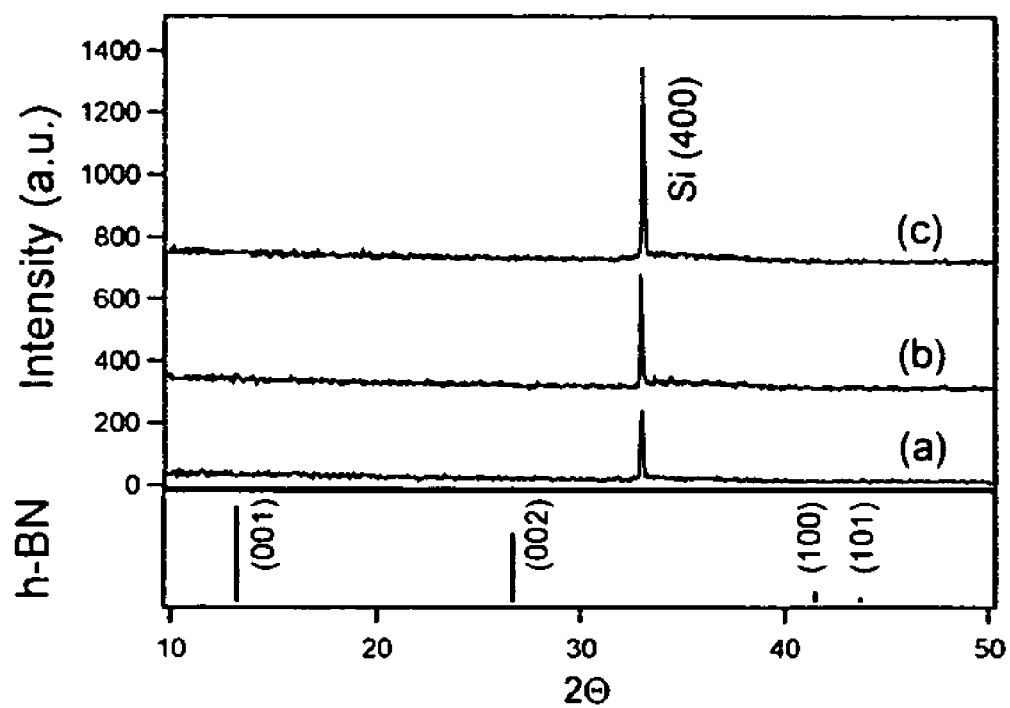
FIG. 4 shows the XRD spectra of (a) 134 nm film deposited at 500° C. using DMAB without reactive gas, (b) 67 nm film deposited at 360° C. using DMAB with 10 sccm $NH_3$, and (c) 7.1 nm $SiO_2$/Si substrate.

FIG. 4 shows the XRD result for a 134 nm film deposited at 500° C. on SiO$_2$ (a), with the proportional intensities of crystalline h-BN as a reference shown at the bottom. FIG. 4 also illustrate (b) 67 nm film deposited at 360° C. using DMAB with 10 sccm NH$_3$ and (c) 7.1 nm SiO$_2$/Si substrate. The relatively featureless spectra indicate that the film is amorphous. The film surface roughness was measured using atomic force microscopy. The root-mean-square (RMS) surface roughness of the films increased with temperature, measuring 0.36 nm at 360° C., 0.44 nm at 420° C., and 0.53 nm at 500° C.

Example 3

The Effect of Ammonia on Film Deposition and Properties

Films were deposited by CVD on thermal $SiO_2$ at 360° C. and 1 Torr to study the effect of $NH_3$ as a reaction gas on films deposited using DMAB. The argon carrier gas flow rate was again held constant at 10 sccm through the DMAB bubbler, with the ammonia flow rate varied from 0 to 10 sccm. Table II shows the resulting film composition and the dielectric constant for the films deposited with varying ammonia flow rate. As the ammonia flow rate increased the nitrogen content increased in the film, displacing carbon and some boron in the film. The nitrogen to boron ratio increased from 0.15 with no ammonia flow to 0.58 with 10 sccm ammonia. At 10 sccm ammonia, both the carbon and oxygen in the film decreased to less than 3%. The approximate deposition rate increased to 0.60 nm/min at the lower ammonia flow rates (0.4 and 1.0 sccm) compared to 0.34 nm/min for no ammonia flow, and decreased to 0.49 nm/min at 10 sccm. Ammonia flow rates higher than 10 sccm lowered the deposition rate further. The decrease in deposition rate at higher $NH_3$ flow rates illustrates that the surface reaction becomes mass transfer limited from the DMAB as the higher $NH_3$ flow dilutes the DMAB concentration at the surface.

TABLE II

| sccm $NH_3$ | % B | % C | % N | % O | k |
|---|---|---|---|---|---|
| none | 69.4 | 10.5 | 17.8 | 2.3 | 4.62 |
| 0.4 | 67.0 | 22.6 | 9.3 | 1.1 | 4.51 |
| 1 | 65.0 | 27.2 | 7.0 | 0.9 | 4.45 |
| 10 | 61.1 | 35.7 | 2.8 | 0.5 | 4.32 |

The introduction of nitrogen into the films using ammonia illustrated a reduction in k. Table II shows the dielectric constant decreasing from 4.62 with no ammonia flow to 4.32 with 10 sccm $NH_3$. The value of n (633 nm) decreased with the same trend as the dielectric constant from 2.069 with no ammonia to 1.893 with 10 sccm ammonia. Using an even higher ratio of $NH_3$ to argon carrier flow (10:1) resulted in a film with a higher N:B ratio of 0.64 with k of 4.11 and n (633 nm) of 1.826.

Figure 5:
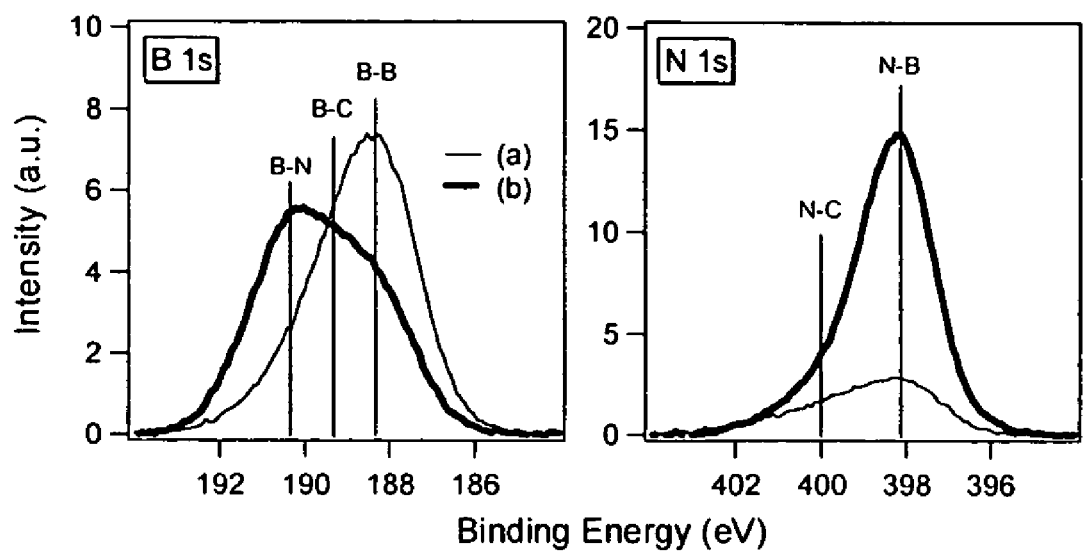
FIG. 5 depicts the XP spectra of B 1s and N 1s for films deposited on $SiO_2$ at 360° C. using DMAB with either (a) 0 or (b) 10 sccm $NH_3$.

FIG. 5 shows the B 1s and N 1s XP spectra for films deposited with no ammonia and 10 sccm ammonia. The addition of $NH_3$ shifted the B 1s peak to a higher binding energy illustrating an increase in B—N bonding at 190.4 eV with a decrease in B—C and B—B bonding. The corresponding N 1s peak also displays a large increase in N—B bonding at 398.1 eV with the addition of $NH_3$. The XRD spectrum shown in FIG. 4 corresponding with line (b) for a 67 nm film deposited with 10 sccm $NH_3$ shows no such evidence of crystalline order. High-resolution transmission electron microscopy and selected area electron diffraction analysis of a similar film deposited using 1 sccm $NH_3$ further confirmed that the film has an amorphous structure. RMS surface roughness measured by AFM ranged from 0.30 to 0.36 nm, with the higher roughness being for films deposited using 10 sccm $NH_3$.

The dielectric constant, k, of the films ranged from 4.11 to 4.83, with the lowest k found using high $NH_3$ to precursor flow rates and the highest k resulted at 500° C. The index of refraction changed consistently with the dielectric constant, ranging from 1.826 to 2.226. The films were found to be amorphous, with smooth RMS surface roughness ranging from 0.30 nm to 0.53 nm. Films deposited at higher temperature had higher nitrogen and carbon content due to the decomposition of the methylamine ligand on the precursor. The addition of ammonia led to N:B ratios as high as 0.64 within these process conditions, with nitrogen displacing carbon and some boron in the film composition, while reducing the dielectric constant.

Example 4

Deposition with $NH_3$ and $C_2H_4$ Coreactants

Films with a dielectric constant of less than 4 were deposited at 360° C. and 1 Torr on $SiO_2$ by introducing $C_2H_4$ with both $NH_3$ and Ar carrier flow each held constant at 10 sccm. Table III shows that k drops from 4.32 with no $C_2H_4$ to 3.67 with 2.5 sccm $C_2H_4$. The introduction of $C_2H_4$ led to C incorporation with a C:B ratio of 0.94 using 2.5 sccm $C_2H_4$ and 1.51 using 20 sccm $C_2H_4$. Carbon from $C_2H_4$ is more readily incorporated than nitrogen from $NH_3$. As observed for $NH_3$, increasing the $C_2H_4$ flow led to lower deposition rates. $C_2H_4$ delivered at 0.5 and 2.5 sccm lowered the deposition rate to 0.23 and 0.08 nm/min, respectively, compared to 0.34 nm/min with no $C_2H_4$. Table III also shows the stoichiometric composition of the resulting films. It is interesting to note that as carbon is incorporated and C:B ratios of 0.65 to 1.51 are achieved, the N:B ratio is nearly constant at 0.32.

TABLE III

Summary of atomic composition (%), dielectric constant (k), index of refraction (n), and RMS roughness (RMS) for films deposited at 1 Torr and 360° C. on $SiO_2$ using DMAB, 10 sccm $NH_3$ coreactant, and varying $C_2H_4$ coreactant.

| sccm $C_2H_4$ | | % B | % N | % C | % O | k | n | RMS (nm) |
|---|---|---|---|---|---|---|---|---|
| 0 | $BC_{0.05}N_{0.58}$ | 61.1 | 35.7 | 2.8 | 0.5 | 4.32 ± 0.02 | 1.893 | 0.36 |
| 0.5 | $BC_{0.65}N_{0.34}$ | 50.0 | 16.8 | 32.7 | 0.4 | 3.80 ± 0.03 | 1.859 | 0.59 |
| 2.5 | $BC_{0.94}N_{0.32}$ | 44.0 | 14.4 | 41.3 | 0.3 | 3.67 ± 0.08 | 1.838 | 0.65 |
| 20 | $BC_{1.51}N_{0.32}$ | 35.4 | 11.2 | 53.3 | — | — | — | — |

Films deposited using both $NH_3$ and $C_2H_4$ as coreactant gases appeared amorphous. The introduction of $C_2H_4$ with $NH_3$ as a coreactant led to rougher films, increasing from 0.36 nm with no $C_2H_4$ flow to 0.59 and 0.65 nm using 0.5 and 2.5 sccm $C_2H_4$, respectively. The surface topology shows an increase in both the height variation and sharpness of the peaks compared to the other surfaces.

Films were also deposited by flowing $C_2H_4$ at 0.5 sccm and varying the Ar carrier gas flow rate to vary the $C_2H_4$:Ar flow ratio. Table IV summarizes the % composition, k, n, and roughness results for films deposited by varying the $C_2H_4$:Ar ratio. C is more readily incorporated into the film in the absence of $NH_3$, achieving a higher % C for a comparable $C_2H_4$:Ar ratio (44.7% compared to 32.7% C with 0.5 sccm $C_2H_4$ and 10 sccm $NH_3$). At the lower $C_2H_4$:Ar ratio of 0.017, a C:B ratio of 0.63 is achieved and results in a k of 3.68. Increasing the $C_2H_4$:Ar ratio to 0.050 increased the C:B ratio to 0.86 but did not reduce k measurably (3.66). Table IV further shows the atomic composition of the resulting films shifts to higher C:B ratio (increasing from 0.26 to 0.86) over the process range, and lower N:B ratio (to 0.05).

TABLE IV

Summary of atomic composition (%), dielectric constant (k), index of refraction (n), and RMS roughness (RMS) for films deposited at 1 Torr and 360° C. on $SiO_2$ using varying $C_2H_4$:Ar flow ratio.

| $C_2H_4$:Ar | $C_2H_4$ sccm | | % B | % N | % C | % O | k | n | RMS (nm) |
|---|---|---|---|---|---|---|---|---|---|
| 0 | 0 | $BC_{0.26}N_{0.15}$ | 69.4 | 10.5 | 17.8 | 2.3 | 4.62 ± 0.03 | 2.069 | 0.31 |
| 0.017 | 0.5 | $BC_{0.63}N_{0.06}$ | 58.5 | 3.8 | 37.1 | 0.6 | 3.68 | 1.927 | 0.45 |
| 0.050 | 0.5 | $BC_{0.86}N_{0.05}$ | 52.2 | 2.5 | 44.7 | 0.7 | 3.66 ± 0.05 | 1.887 | 0.36 |

As the $C_2H_4$:Ar ratio increased, the B1s spectra show increased intensity of the B—C bonding environment and decreased intensity of B—N and B—B bonding. The C1s spectra intensify in the C—C compared to C—B region. The N1s spectra indicate that the overall nitrogen content is decreasing. Compared to increasing $C_2H_4$ with 10 sccm $NH_3$, increasing the $C_2H_4$:Ar ratio led to films that had less B—C intensity and increased B—B and C—C intensity. Again, the introduction of $C_2H_4$ as a coreactant led to rougher films compared with no coreactant. The surface topology appeared to be uniform with broader peaks compared to the other surfaces. An approximately 1 μm boron carbo-nitride film deposited on Si at 360° C. using 0.5 sccm $C_2H_4$ coreactant was measured using nanoindentation to determine the film hardness and modulus. The hardness was measured as 8.7 GPa and the modulus was 71.3 GPa. These values are lower than measured for a boron carbo-nitride film deposited with no coreactant, with a hardness of 12.2 GPa and modulus of 102 GPa.

It should be noted that many variations and modifications might be made to the embodiments described above without substantially departing from the principles of the present invention. All such variations and modifications are intended to be included herein within the scope of the present invention, as set forth in the following claims.

What is claimed is:

1. A method of forming a boron carbo-nitride layer comprising:
    forming a boron carbo-nitride layer on a substrate by thermal chemical vapor deposition using a boron source precursor comprising $NR_3$: $BX_3$, wherein X is selected from the group consisting of hydrogen and halide and wherein R is selected from the group consisting of hydrogen, alkyl, allyl, alkenyl, alkynyl alkylaryl, arylalkyl, phenyl, alkene and alkyne.

2. The method according to claim 1, wherein the boron source precursor comprises a dimethylamineborane complex.

3. The method according to claim 1, wherein each R is the same.

4. The method according to claim 1, wherein each R is different.

5. The method according to claim 1, wherein two R components are the same.

6. The method according to claim 1, wherein forming a boron carbo-nitride layer comprises forming the boron carbo-nitride layer by thermal chemical vapor deposition on an microelectronic substrate using a boron source precursor that includes an amine with hydrogen and/or alkyl groups bonded to $BH_3$ at a deposition temperature that is less than about 500° C.

7. The method according to claim 6, wherein the deposition temperature is less than about 420° C.

8. The method according to claim 6, wherein the deposition temperature is about 360° C.

9. The method according to claim 1, wherein the precursor has a composition $(CH_3)_2NH:BH_3$.

10. The method according to claim 1 further comprising:
    providing a microelectronic substrate within a chemical vapor deposition chamber;
    vaporizing the boron source precursor with a vaporizer to form a flowing vaporized precursor stream; and
    directing the flowing vaporized precursor stream to flow into the chamber with the substrate therein under conditions effective to chemical vapor deposit a dielectric layer over the substrate.

11. The method according to claim 10, wherein the boron source precursor is combined with a nitrogen source, wherein the nitrogen source is ammonia.

12. The method according to claim 10, wherein a deposition temperature is from about 300° C. to 500° C.

13. The method according to claim 10, wherein the deposition temperature is from about 360° C. to 450° C.

14. The method according to claim 10, comprising depositing the boron carbo-nitride layer to a thickness of from about 20 Angstroms to about 1000 Angstroms.

15. The method according to claim 10, further comprising vaporizing a second precursor and depositing the second precursor on the first boron carbo-nitride layer.

16. The method according to claim 10, further comprising combining the vaporized first and second precursors prior to flowing them to the chamber to chemical vapor deposit a first dielectric layer.

17. The method according to claim 16, further comprising vaporizing a third precursor and depositing the third precursor on the previous deposited layer.

* * * * *